(12) United States Patent  (10) Patent No.: US 7,818,491 B2
Baba  (45) Date of Patent: Oct. 19, 2010

(54) NONVOLATILE MEMORY AND ELECTRONIC DEVICE FOR USE THEREWITH

(75) Inventor: Tsutomu Baba, Nagano (JP)

(73) Assignee: Nidec Sankyo Corporation, Nagano (JP)

( * ) Notice: Subject to any disclaimer, the term of this patent is extended or adjusted under 35 U.S.C. 154(b) by 253 days.

(21) Appl. No.: 11/425,276

(22) Filed: Jun. 20, 2006

(65) Prior Publication Data

US 2007/0028032 A1   Feb. 1, 2007

(30) Foreign Application Priority Data

Jun. 21, 2005 (JP) ............................ 2005-180638
Nov. 19, 2005 (JP) ............................ 2005-335068

(51) Int. Cl.
*G06F 12/00* (2006.01)
(52) U.S. Cl. .................. 711/103; 365/185.33; 711/170; 714/42
(58) Field of Classification Search .................. 711/103
See application file for complete search history.

(56) References Cited

U.S. PATENT DOCUMENTS 5,572,466 A * 11/1996 Sukegawa .............. 365/185.33

FOREIGN PATENT DOCUMENTS

JP         8/287697         11/1996

* cited by examiner

*Primary Examiner*—Kevin L Ellis
*Assistant Examiner*—Matthew Bradley
(74) *Attorney, Agent, or Firm*—Frommer Lawrence & Haug LLP

(57) ABSTRACT

A nonvolatile memory may include a count data region provided in a memory region which is counted up according to an updating data and a fiat number of times managing region provided in a memory region which manages the full-counted number of times of the count data region. The nonvolatile memory may include a second number of times managing region which manages the full-counted number of times of the first number of times managing region. The nonvolatile memory is preferably utilized in an electronic device such as a card reader to detect the expiration of service lifetimes of the structural components of the electronic device.

4 Claims, 9 Drawing Sheets

(a) PRIOR ART (b)

NONVOLATILE MEMORY AND ELECTRONIC DEVICE FOR USE THEREWITH

CROSS REFERENCE TO RELATED APPLICATION

The present invention claims priority under 35 U.S.C. §119 to Japanese Application No. 2005-180638 filed Jun. 21, 2005, and Japanese Application No. 2005-335068 filed Nov. 19, 2005, which are incorporated herein by reference.

BACKGROUND OF THE INVENTION a) Field of the Invention

The present invention relates to a nonvolatile memory such as an EEPROM and an electronic device which utilizes the nonvolatile memory.

b) Description of Related Art and Problems Addressed by the Invention

A nonvolatile memory (for example, EEPROM or flash memory) has been conventionally utilize as a memory in which a stored content can be maintained even when a power supply is interrupted and in which a stored content is capable of being rewritten electrically. This nonvolatile memory has a limit in the number of times of rewriting for each rewriting minimum unit (2 bytes, for example). Therefore, development of various memory techniques has been performed to extend the service lifetime of a memory as long as possible while assuring its number of times of rewriting.

One of the memory techniques is that the rewriting number of times for each rewriting minimum unit is preserved as a memory management data in a nonvolatile memory and updating data is rewritten on the basis of this memory management data.

For example, a memory region to be recorded with updating data is determined in advance on the basis of the above-mentioned memory management data and the data is written into an appropriate memory region. In this manner, the rewriting number of times in all memory regions is uniformed to be capable of extending the service lifetime of the memory. Further, rewriting of data is continuously performed in a specified memory region and, when a limited number of times is reached on the basis of the memory management data, the place of the recorded data is changed to be recorded in another memory region. In this manner, the updating of data can be performed more than the limited number of times of rewriting (see, for example, Japanese Patent Laid-Open No. Hei 8-287697, paragraph [0002]).

When a nonvolatile memory is used as a counter which counts the number of times of occurrence of a certain event the latter prior art of the two memory techniques described above is utilized. However, when the memory management data is updated (incremented) each time the event occurs (counted), the memory management data (rewriting number of times) becomes to be equal to the count value itself which is the number of times of occurrence of the event. Therefore, in this case, the court value itself is used as a judging item of the memory management and the memory region for writing data is changed.

More specifically, when the updating number of times of a counter reaches an upper knit number of times of rewriting, count is newly started from "zero" in another memory region. Further, when the total sum value of the counter is to be acquired, the total sum of all memory regions which have been used as a counter is obtained.

However, in the case that a nonvolatile memory is used as a counter, when the above-mentioned memory technique is utilized, a processing which rewrites a blank is repeatedly performed in a memory region of a blank digit (digit where data is zero). Therefore, the memory region reaches its service lifetime even when the memory region is not used as a counter function and thus a memory is not used efficiently.

For example, when a count-up is to be performed to 1,600,000 times by using a nonvolatile memory whose rewriting minimum unit (one block) is one word (2 bytes) and whose rewriting upper limit number of times in each block is 1,000,000 times, the following steps will be performed.

First, in one block of the nonvolatile memory, count-up can be performed up to 65,536 ($=2^{16}$) times. In other words, 1,000,000 times of count-up which is the upper limit number of times of rewriting cannot be performed with only one block. Therefore, in order to count-up to 1,000,000 times which is the upper limit number of times of rewriting, another memory region of 4 bits is required in addition to one block (2 bytes). When a memory region of 2 bytes and 4 bits is provided, count-up can be performed up to $2^{20}$ times=1,048,576 times.

However, as described above, when the minimum unit for rewriting in an nonvolatile memory is one block (2 bytes), two blocks of memory region are required.

As a result; when count-up to 16,000,000 times is to be performed by using a method in which, when writing to a memory region of 2 blocks (count-up to 1,000,000 times) has been finished, next writing starts from zero in another memory region of 2 blocks, a memory region of 2 blocks×16=32 blocks is required. However, actually, in respective 2 blocks, the data of a counter value is not written and only erase rewriting is performed in 1 byte at the highest position and a higher 1 nibble (1 nibble=4 bits) in the higher third byte position. Therefore, the region of the 1 byte at the highest position and the higher 1 nibble in the higher third byte position is left to be unused as a counter function (see FIG. 10). Accordingly, the memory is not used efficiently and effectively.

OBJECT AND SUMMARY OF THE INVENTION

In view of the problems described above, an embodiment of the present invention may advantageously provide a nonvolatile memory which is capable of realizing a counter function while reducing a memory region as much as possible where erase rewriting is performed without updating data of a counter value and capable of being used efficiently with less waste, and may advantageously provide an electronic device with the use of the nonvolatile memory.

Thus, according to an embodiment of the present invention, there may be provided a nonvolatile memory whose memory region is provided with a count data region and a number-of-times managing region which manages the full-counted number of times of the count data region.

More specifically, the present invention may provide the following embodiments.

(1) A nonvolatile memory including a count data region which is provided in a memory region and which is counted-up according to an updating data, and a first number of times managing region which is provided in a memory region and which manages a full-counted number of times of the count data region.

According to an embodiment of the present invention, the memory region of a nonvolatile memory is provided with a count data region which is counted up according to updating data such as the open/close number of times of a shutter, for example, in a card reader, and a first number of times managing region which manages the full-counted number of times of the count data region. Therefore, in this embodiment, the memory region where erase rewriting is performed without updating the data of a counter value can be reduced and thus the memory region can be efficiently used with less waste.

In this specification, "full count" means that the counted number of times in the count data region has reached a specified limited number of times and also means that the counted number of times has approached the vicinity of the specified limited number of times. For example, in a count data region which is structured of blocks (one block=2 bytes), when a count can be performed "0" through FFFF (hexadecimal number), i.e., "0xFFFF" in the respective blocks, respective rabbles in the first number of times managing region (2 bytes) may manage the full-counted number of times up to "0xFFFF" of the corresponding respective blocks. Alternatively, the respective nibbles in the first number of times managing region (2 bytes) may manage the number of times of the corresponding respective blocks which is full-counted up to the vicinity of "0xFFFF" (nearly full-counted number of times).

(2) In the nonvolatile memory described in the above-mentioned [0016] (1), the nonvolatile memory farther comprises a second number of times managing region which is provided in a memory region and which manages a number of times of the first number of times managing region being full-counted, and each of the count data region, the first number of times managing region and the second number of times managing region is structured with a block unit that is a rewriting minimum unit for the updating data.

According to an embodiment of the present invention, a second number of times managing region is provided in a memory region for managing the full-counted number of times of the first number of times managing region and each of the count data region, the first number of times managing region and the second number of times managing region is structured with a block unit which is a rewriting minimum unit for the updating data. Therefore, a memory region of the rewriting minimum unit (1 block), a part of which is left to be unused as a counter function, is efficiently managed in the number of times managing region which is structured with a block unit and thus the memory region can be efficiently used with less waste.

(3) In the nonvolatile memory described in the above-mentioned [0018](2), these second number of times managing region includes a bit string comprised of a predetermined number of bits and the second number of times managing region manages the full-counted number of times of the first number of times managing region by means of that either one bit of the bit string is set to be "1" and all other bits of the bit string are set to be "0".

According to an embodiment of the present invention, the second number of times managing region includes a bit string comprised of a predetermined number of bits and the second number of times managing region manages the full-counted number of times of the first number of times managing region by means of that either one bit of the bit string is set to be "1" and all other bits of the bit string are set to be "0" (for example, "0001", "0010", "0010" or "1000" when the bit string is 4 bits). Therefore, data processing can be efficiently performed.

In order to manage the full-counted number of times of the first number of times managing region with the use of the second number of tines managing region, for example, it may be conceivable that the full-counted number of times is managed such that "0001" means once, "0010" means twice, "0011" means tree times, and "0100" means four times. However, in this case, in order to recognize the data content of the second number of times managing region, after the data of the second number of times managing region is read out, the data is required to be recognized as a numerical value by software. Therefore, some time is required to recognize the data content of the second number of times managing region and thus improvement is needed for efficient data processing. However, according to the above-mentioned embodiment of the present invention the second number of times managing region manages the full-counted number of times of the first number of times managing region by means of that only one bit of the bit string is set to be "1" and all other bits of the bit string are set to be "0" such that "0001" means once, "0010" means twice, "0100" means three times and "1000" means four times. Therefore, when the data content in the second number of times managing region is recognized, after the data in the second number of times managing region has been read out, a required bit may be extracted by an AND processing, i.e., a mask processing may be applied. Accordingly, since a processing for recognizing the read data as a numerical value by software is not required, the data content in the second number of times managing region can be recognized with a short time and thus data processing can be efficiently performed.

(4) An electronic device comprising a nonvolatile memory and a data processing means which reads and writes data from and in the nonvolatile memory. The nonvolatile memory includes a count data region which is counted up according to an updating data, a first number of times managing region which manages the full-counted number of times of the count data region, a second number of times managing region which manages the full-counted number of times of the first number of times managing region, and each of the count data region, the first number of times managing region and the second number of times managing region is structured with a block unit which is a rewriting minimum unit for the updating data. Further, the second number of times managing region manages a used number of times of structural components in the electronic device on the basis of processing results of the data processing means.

According to an embodiment of the present invention, in an electronic device (for example, a card reader) including a nonvolatile memory and a data processing means (for example, a CPU or a memory control circuit) which reads and writes data from and in the nonvolatile memory, the memory region of the nonvolatile memory includes the count data region, the first number of times managing region, the second number of times managing region, and each of the count data region, the first number of times managing region and the second number of times managing region is structured with a block unit which is a rewriting minimum unit for the updating data, and the second number of times managing region manages a used number of times of structural components (for example, a shutter, a drive roller and a magnetic head) in the electronic device on the basis of processing contents of the data processing means. Therefore, an electronic device can be provided in which waste of a memory region is reduced and memory resource is effectively and efficiently used.

(5) In the electronic device described in the above-mentioned [0023] (4), the second number of times managing region includes a bit string comprised of a predetermined number of bits, and the used number of times of the structural component in the electronic device is managed by the data processing means which sets either one bit of the bit string to be "1" and all other bits of the bit string to be "0".

According to an embodiment of the present invention, in order that the above-mentioned second number of times managing region manages the used number of times of the structural components in an electronic device, the data processing means sets either one bit of the bit string comprised of a predetermined number of bits to be "1" and all other bits of the bit string to be "0". Therefore, as descried above, after the data of the second number of times managing region is read out, the data content of the second number of times managing region can be recognized only by extracting a required bit with an AND processing (i.e., only by applying a mask processing).

Especially, the second number of times managing region manages the used number of times of the structural components (for example, a shutter, a drive roller and a magnetic head) in an electronic device. Therefore, since the data content of the second number of times managing region can be recognized with a short time, the expiration of service lifetime of the structural component can be detected at a high speed.

As described above, in accordance with this embodiment of the present invention, both the merits can be attained one of which is that waste of a memory region is reduced and memory resource is effectively and efficiently used, and the other of which is that the expiration of service lifetime of the structural component can be detected at a high speed.

(6) In the electronic device described in the above-mentioned [0025] (5), the second number of times managing region includes a plurality of bit strings in correspondence with used number of times of a plurality of structural components in the electronic device, and the data processing means detects the expiration of the service lifetime of the structural components in the electronic device by referring to the bit patterns of the plurality of bit strings.

According to an embodiment of the present invention, the above-mentioned second number of times managing region includes a plurality of bit strings in correspondence with used number of times of a plurality of structural components in the electronic device, and the data processing means detects the expiration of the service life time of the structural components in the electronic device by referring to the bit patterns of the plurality of bit strings. Therefore, the expiration of the total service lifetime of an electronic device having a plurality of functions can be detected at a high speed.

For example, in a case that the electronic device is a card reader, respective bit patterns of bit strings are referred which are a bit string for counting the reciprocated number of times of a card on a magnetic head, a bit string for counting the number of times of opening and closing a shutter, a bit string for counting the set number of times of IC contacts, and a bit string for counting the number of times of card ejection and, when at least either one of the bit patterns is a specified bit pattern which is defined in advance (when a predetermined bit of the bit string is "1"), the expiration of service lifetime of either structural component of the magnetic head, the shutter, the IC contacts and the card ejection mechanism can be detected at a high speed. Further, it can be also detected which service lifetime of the structural components has been expired at a high speed by referring to the bit pattern in the specified bit string.

The "bit pattern" in this specification means the arranging forms of bits in a bit string such as "0001", "0010", "0100" and "1000".

EFFECTS OF THE INVENTION

According to an nonvolatile memory and an electronic device using the nonvolatile memory in accordance with the present invention, the memory region where erase rewriting is conventionally performed without updating the data of a counter value can be reduced and thus the memory resource can be effectively and efficiently used. Further, the expiration of service lifetime of structural components in an electronic device such as a card reader can be detected at a high speed by referring to the bit patterns in a plurality of bit strings provided in the second number of times managing region.

Other features and advantages of the invention will be apparent from the following detailed description, taken in conjunction with the accompanying drawings that illustrate, by way of example, various features of embodiments of the invention.

Memory Management

Figure 3:
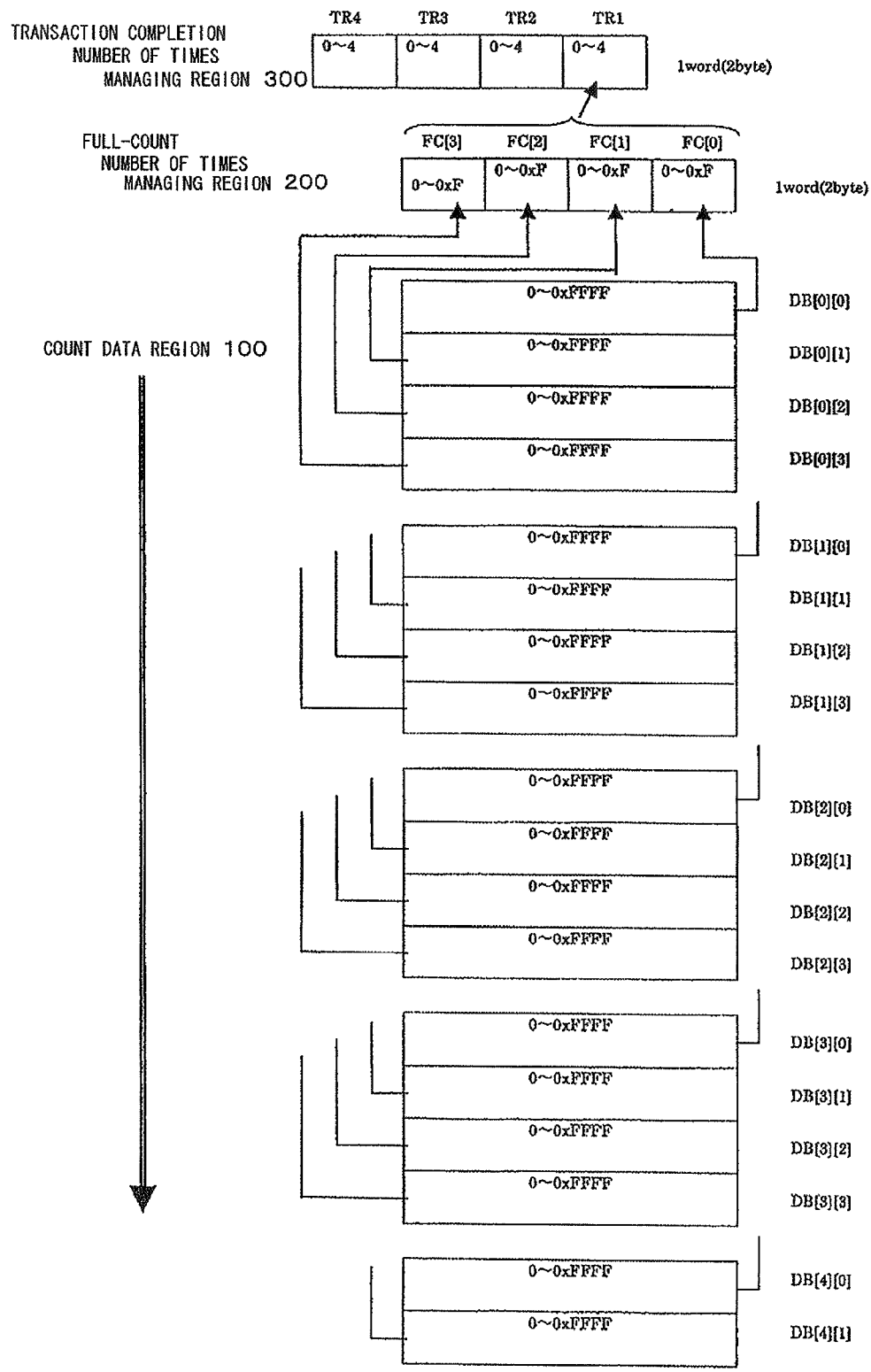
Figure 4:
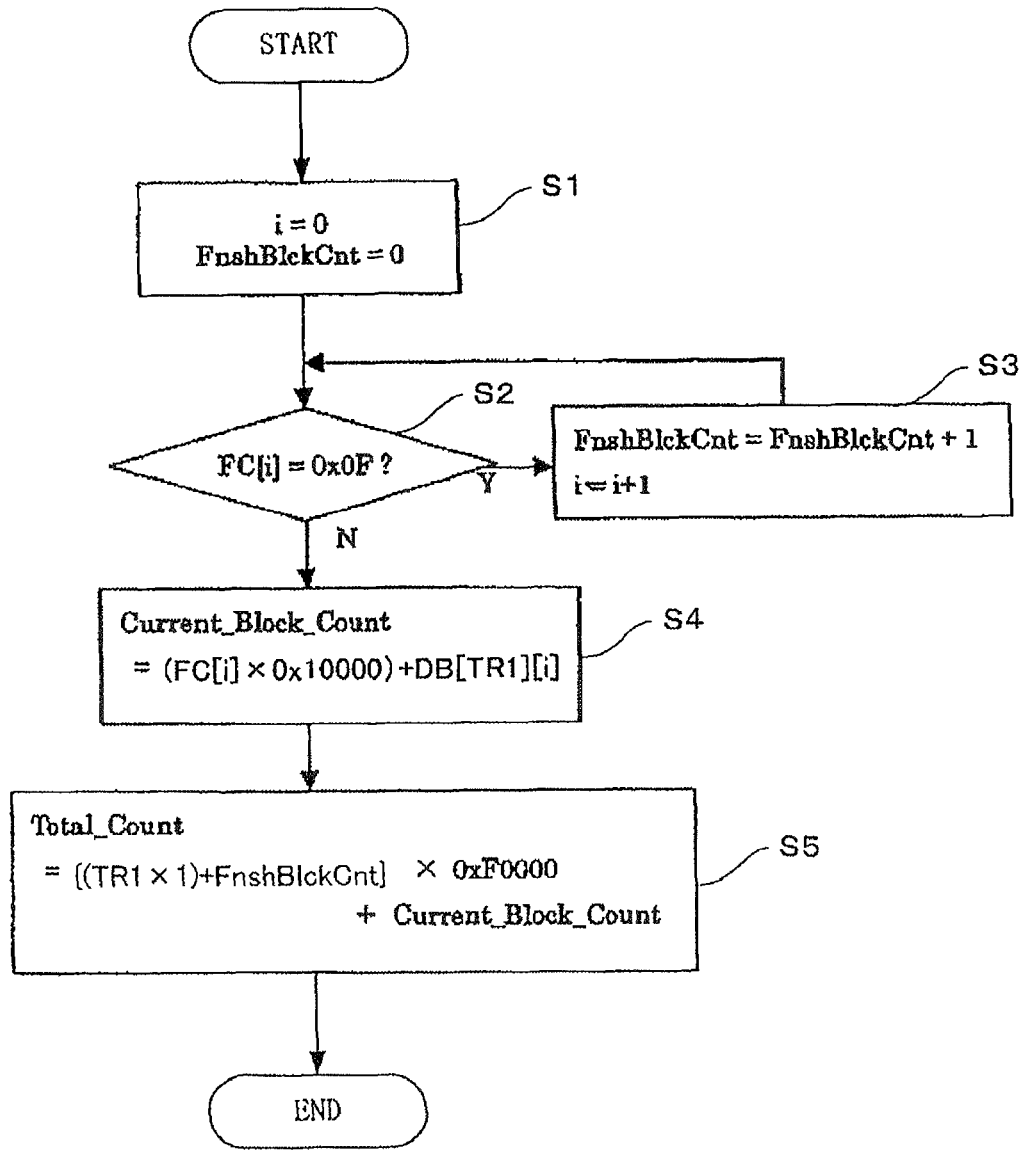
Figure 5:
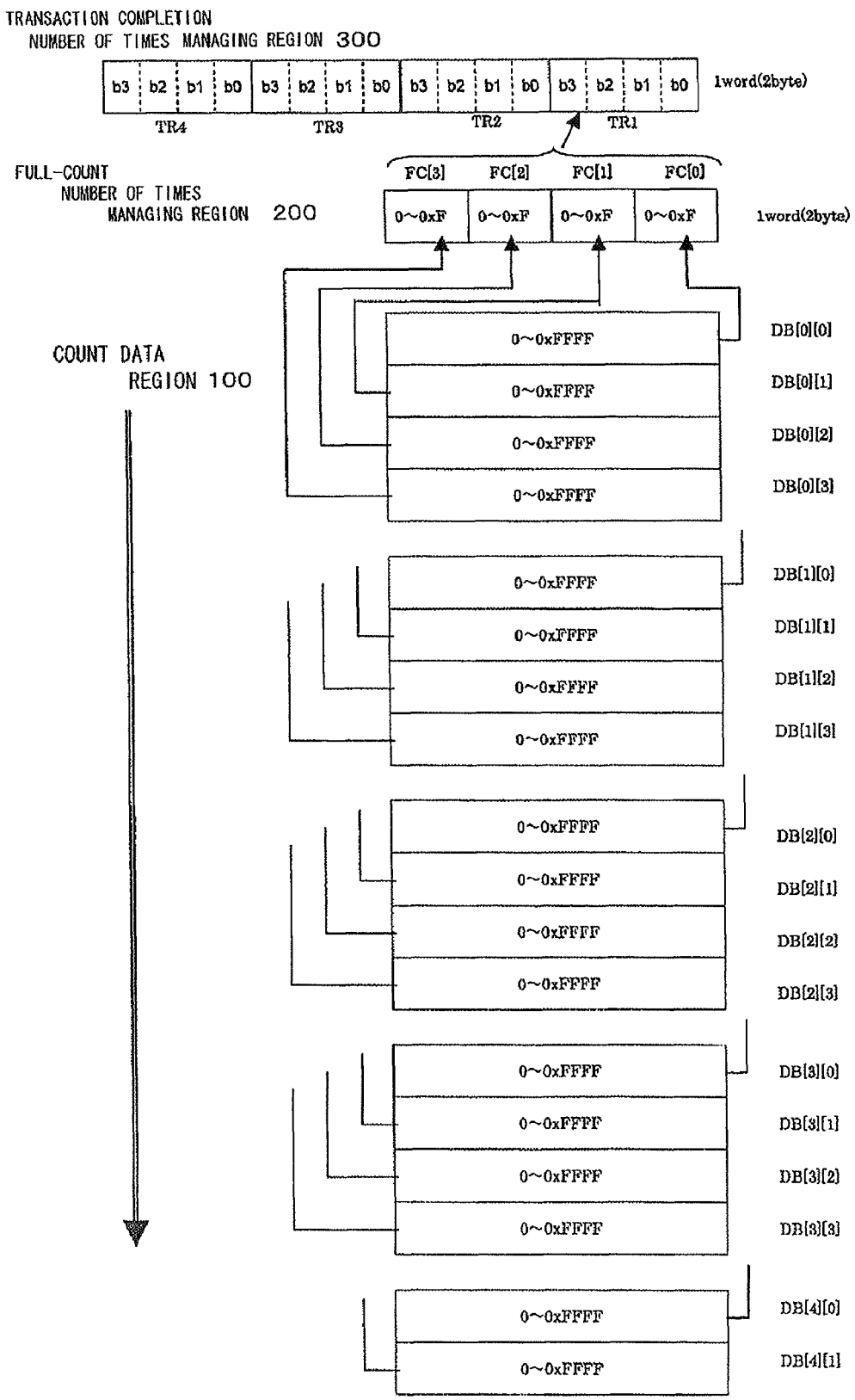
Figure 6:
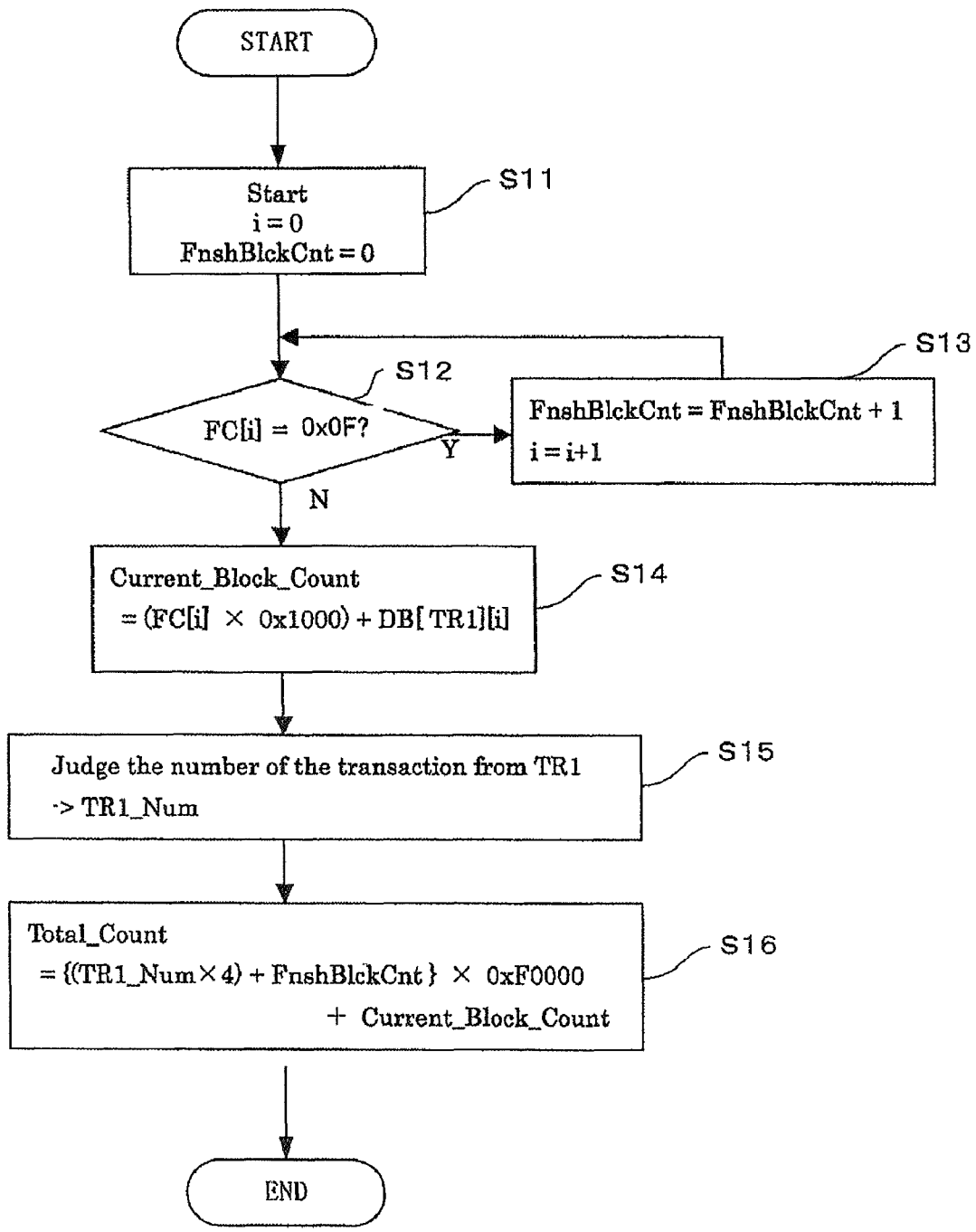
Figure 7:
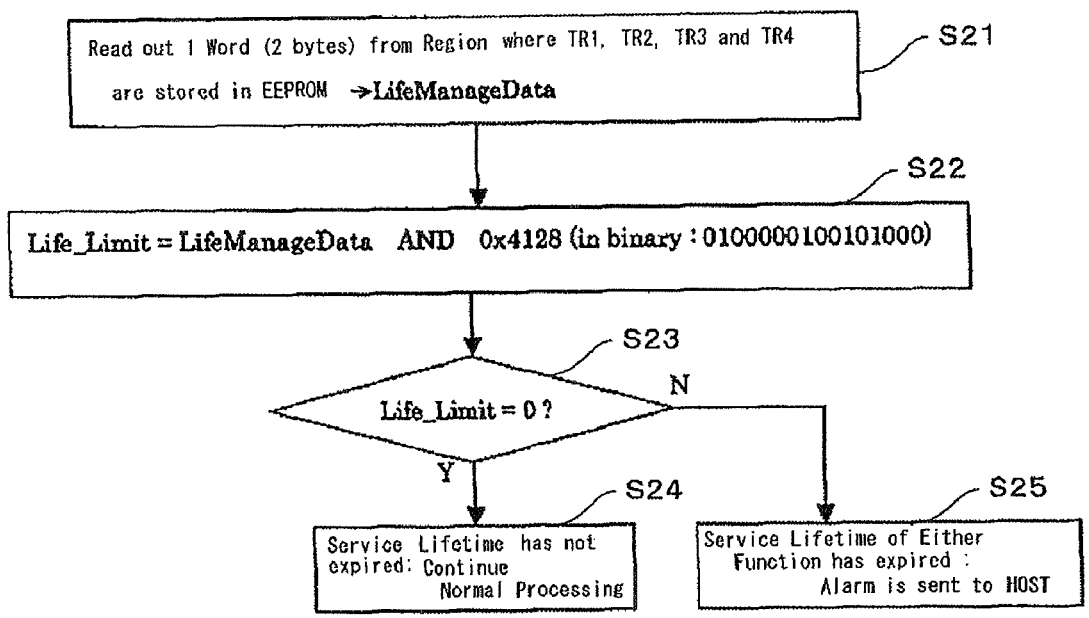
Figure 8:
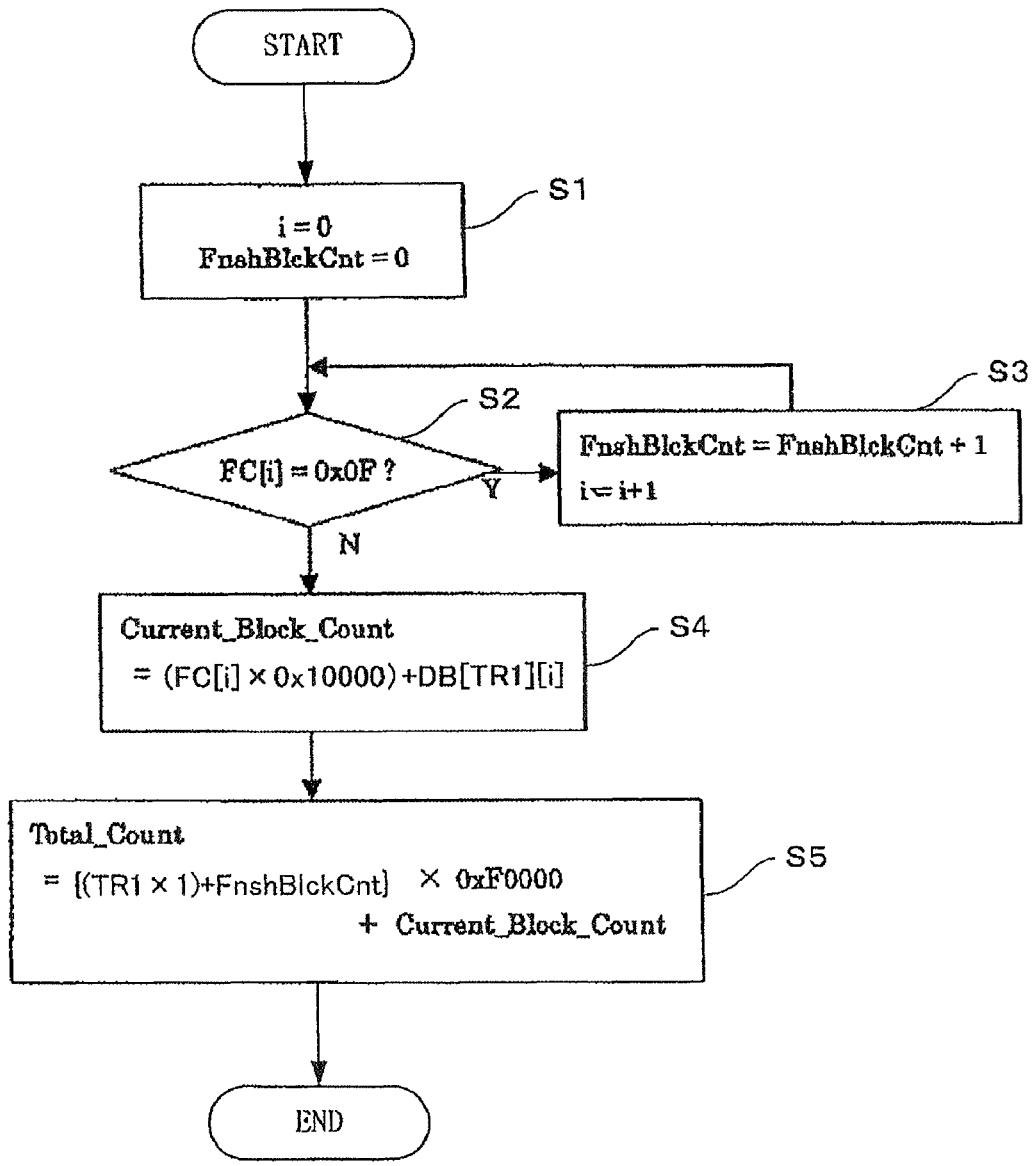
Figure 9:
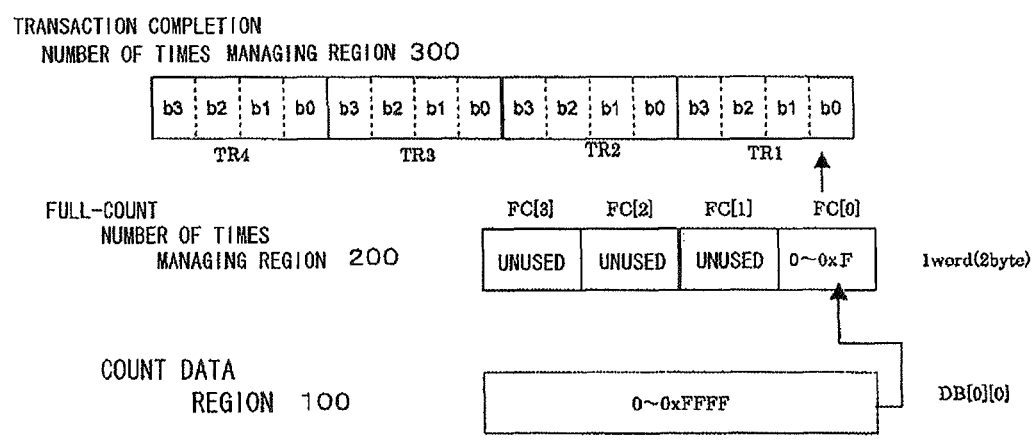
Figure 10:
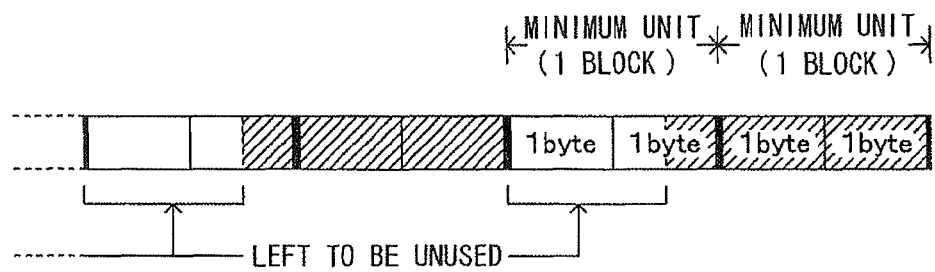

FIG. 3 is a view showing a memory region of an nonvolatile memory in accordance with an embodiment;

FIG. 4 is a flowchart showing a calculation method for a count value when a nonvolatile memory in accordance with an embodiment is used as a counter;

FIG. 5 is a view showing a memory region of a nonvolatile memory in accordance with another embodiment;

FIG. 6 is a flowchart showing a calculation method for a count value when a nonvolatile memory in accordance with another embodiment is used as a counter;

FIG. 7 is a flowchart showing the detection method of the expiration of a service lifetime for components of an electronic device (card reader) in accordance with another embodiment;

FIG. 8 is a view showing a memory region in which two blocks in a count data region are managed by a full-count number of times managing region;

FIG. 9 is a view showing a memory region in which one block in a count data region is managed by a full-count number of times managing region; and FIG. 10 is an explanatory view showing a memory management in a conventional nonvolatile memory.

DETAILED DESCRIPTION OF THE PREFERRED EMBODIMENTS

Embodiments of the present invention will be described below with reference to the accompanying drawings. In accordance with an embodiment one block is comprised of one word (2 bytes) and a nonvolatile memory whose upper limit number of times of rewriting is 1,000,000 times is used for count-up to about 16,000,000 times (16,777,215 times).

However, according to the present invention, other parameters may be adopted.

Figure 1:
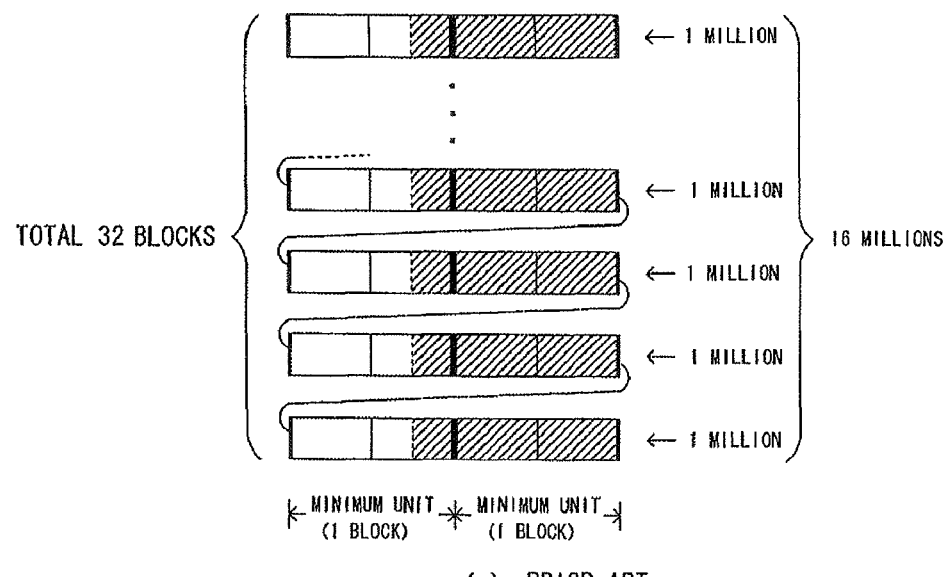
FIG. 1(a) is an explanatory view showing a conventional outline when a nonvolatile memory is used as a counter and FIG. 1(b) is an explanatory view showing an outline when a nonvolatile memory in accordance with an embodiment of the present invention is used as a counter.
Figure 1:
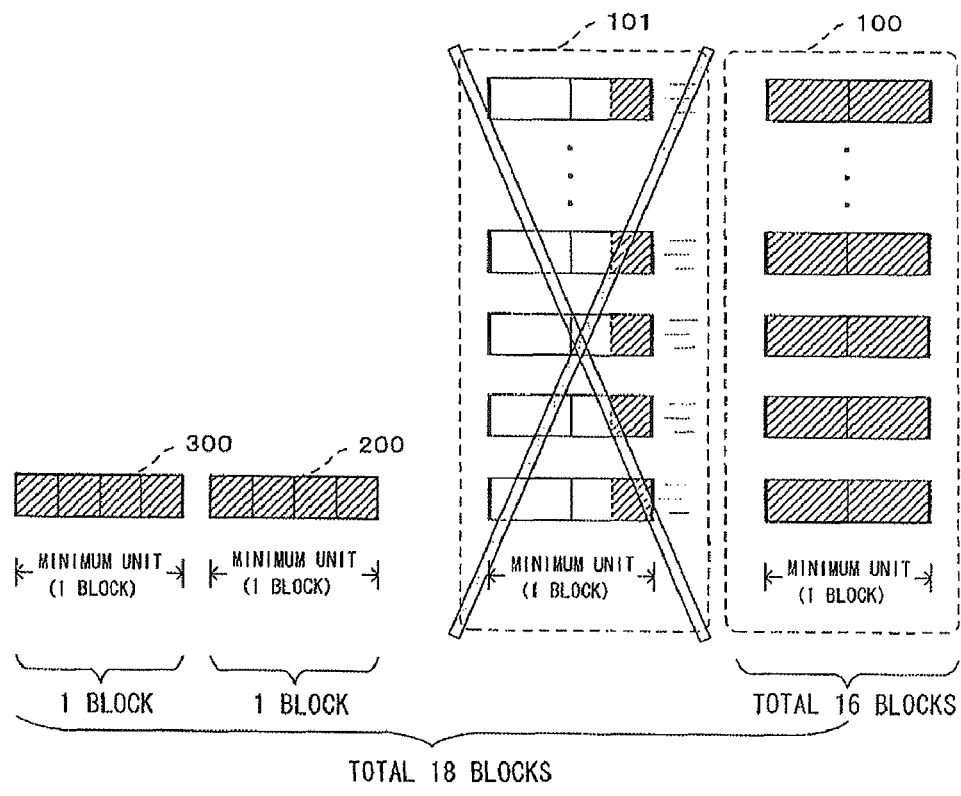

FIG. 1(a) is an explanatory view showing a conventional outline when a nonvolatile memory is used as a counter and FIG. 1(b) is an explanatory view showing an outline when a nonvolatile memory in accordance with an embodiment of the present invention is used as a counter. Especially, FIG. 1(a) is an explanatory view showing outline in which count-up is performed up to about 16,000,000 times by using a conventional nonvolatile memory. FIG. 1(b) is an explanatory view showing outline in which count-up is performed up to about 16,000,000 times by using a nonvolatile memory in accordance with an embodiment. In the following embodiments of the present invention, a nonvolatile memory is mounted on a card reader but the present invention is not limited to a card reader.

The upper limit number of times of rewriting in a nonvolatile memory is 1,000,000 times. FIG. 1(a) shows a conventional method for count-up to 1,000,000 times by using a memory region of 2 blocks (4 bytes). When the count-up reaches 1,000,000 times, the memory region is changed in the next memory region (2 blocks located in one upper position in FIG. 1(a)) and count-up is newly performed from zero. In this manner, count-up is sequentially performed up to 16,000,000 times from the lowest memory region to upper memory regions in FIG. 1(a). Therefore, a total of 32 blocks of memory regions are required.

However, the memory regions which are actually used are portions which are shown by the slanted lines in FIG. 1(a). Therefore, 1 byte of the highest position and a higher nibble of the higher 3-byte position (blank portion shown in FIG. 1(a)) in the respective 2 blocks, only erase rewriting is performed instead of a counter value is not updated there.

On the other hand, as shown in FIG. 1(b), in a nonvolatile memory in accordance with an embodiment of the present invention, a memory region of 2 blocks (4 bytes) is divided into a higher 2-bytes portion and a lower 2-bytes portion. Further, a memory region which is structured of 16 pieces of the lower 2-bytes portion (1 block) is arranged in a nonvolatile memory as a count data region 100 (see FIG. 1(b)).

Further, a full-count number of times managing region 200 which is comprised of one block and functions as an example of a first number of times managing region is arranged in the nonvolatile memory as a memory region for managing the number of times which is full-counted by respective blocks in the count data region 100 (see FIG. 1(b)).

In addition, a transaction completion number of times managing region 300 which is comprised of one block and functions as an example of a second number of times managing region is arranged in a nonvolatile memory as a memory region for managing the number of times where the full-count number of times managing region 200 reaches 0xFFFF (see FIG. 1(b)). In accordance with an embodiment, the transaction completion number of times managing region 300 manages the used number of times of components in a card reader such as the used number of times of a shutter 7 or a motor 9, and a slid number of times of a card with a magnetic head. Further, the transaction completion number of times managing region 300 is a memory region which manages the full-counted number of times of the full-count number of times managing region 200. Therefore, the transaction completion number of times managing region 300 is not counted till the used number of times of a component in a card reader reaches a prescribed number of times, i.e., till the full-count number of times managing region 200 counts up a prescribed number of times or becomes in a full counted state.

A nonvolatile memory in accordance with an embodiment of the present embodiment includes the count data region 100 comprised of a total of 16 blocks, the full-count number of times managing region 200 comprised of 1 block, and the transaction completion number of times managing region 300 comprised of 1 block in order to count up to 16,000,000 times. The nonvolatile memory will be described in detail in the Memory Management Section described below.

As described above, in a nonvolatile memory in accordance with an embodiment; the full-count number of times managing region 200 is required. However, the memory region comprised of 16 pieces of higher 2-bytes portions (1 block) which are required in FIG. 1(a) (corresponding to a memory region 101 in FIG. 1(b)) is not required, (see FIG. 1(b)). In other words, all the number of blocks required to count up to 16,000,000 times is 32 blocks in the conventional nonvolatile memory shown in FIG. 1(a) but in accordance with an embodiment of the present invention, all the number of blocks is 18 (=16+1+1) as shown in FIG. 1(b). Therefore, when count-up is performed up to 16,000,000 times, only about 60% of the memory region is required with respect to that in the conventional example, and thus a memory can be efficiently used.

Figure 2:
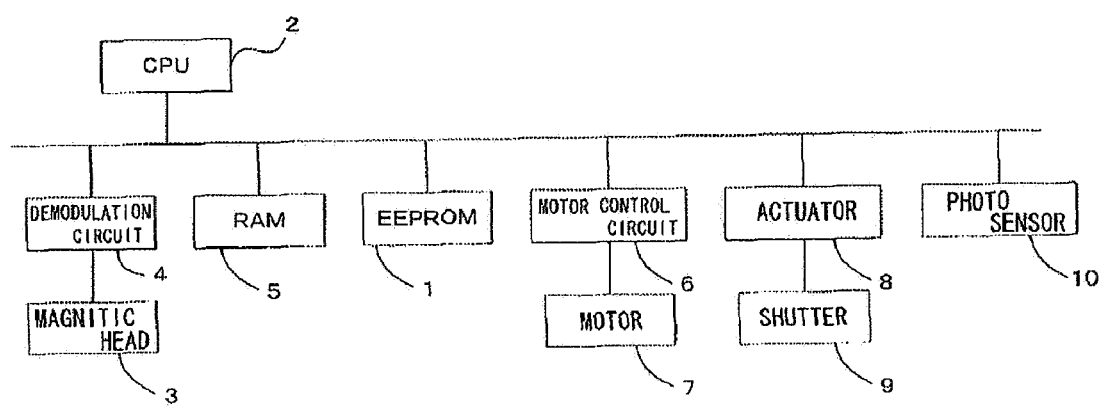
FIG. 2 is a block diagram showing an electrical structure of a card reader which is provided with a nonvolatile memory in accordance with an embodiment.

FIG. 2 is a block diagram showing the electrical structure of a card reader which includes a nonvolatile memory in accordance with an embodiment. In accordance with this embodiment; an EEPROM 1 is used as a nonvolatile memory.

In FIG. 2, a magnetic head 3 for performing transmitting and receiving magnetic data to and from a magnetic card is connected with a CPU 2 which performs a general electrical control through a demodulation circuit 4. The CPU 2 is connected with a RAM 5 which functions as a working area. Further, a motor 7 for rotationally driving a drive roller is connected with the CPU 2 through a motor control circuit (for example, PWM drive control circuit) and a shutter 9 for controlling entering and ejecting of a card is connected with the CPU 2 through an actuator 8. In addition, a plurality of photo sensors 10 for detecting a current card position is connected with the CPU 2. Further, the CPU 2 is incorporated with a ROM which stores information such as control programs and initial values for controlling the card reader. The card reader is provided with IC contacts (not shown in FIG. 2) which are capable of contacting with IC terminals on a card for enabling read/write of data with the CPU 2.

The CPU 2 is connected with the EEPROM 1 which is capable of preserving a stored content even when a power supply is interrupted and whose content can be electrically rewritten. The EEPROM 1 is counted up by the CPU 2 according to updated data such as the opening and closing number of times of the shutter 9 which is detected by the actuator 8 or the number of times of a card which is ejected from or taken in the card reader that is detected by the photo sensors 10. The EEPROM 1 is, as described above, includes the count data region 100, the full-count number of times managing region 200 and the transaction completion number of times managing region 300 in a memory region. The CPU 2 functions as an example of a data processing means which ads and writes data from and into the EEPROM 1. The memory management performed by the EEPROM 1 will be described in detail with reference to FIG. 3.

FIG. 3 is a view showing the memory region of a nonvolatile memory in accordance with an embodiment. In FIG. 3, the upper limit number of times of rewriting in respective blocks is set to be 1,000,000 times and a counter for counting up to 16,777,215 times (=0xFFFFFF times) is structured. When the counter is designed on the basis of the concept in FIG. 1(b), the count data region 100 is comprised of 17 blocks but uses 18 blocks (DB[0][0], DB[0][1], ..., DB [4][1]) in consideration of efficiency of software. Each of the memory regions shown in the DB[0][0], DB[0][1], DB[0][2], DB[0] [3], ... in the count data region 100 is comprised of a rewriting minimum unit (1 block=2 bytes) and is capable of counting from zero to FFFF (hexadecimal number), i.e., 0~0xFFFF (which means hexadecimal number FFFF).

The full-count number of times managing region 200 is comprised of a rewriting minimum unit (1 block=2 bytes) and respective nibbles are shown as FC[0], FC[1], FC[2] and FC[3]. Respective FC[*]'s correspond to 4 blocks of count data and each FC[*] manages the full-count number of times from zero to F (hexadecimal number), i.e., 0~0xF in its corresponding block. In addition, the transaction completion number of times managing region 300 is also comprised of a rewriting minimum unit (1 block=2 bytes) and manages the number of times where the full-count number of times managing region 200 reaches 0xFFFF.

In the EEPROM 1, the respective nibbles of the transaction completion number of times managing region 300 are set to be TR1, TR2, TR3 and TR4. Each of the TR's manages the transaction completion number of times in a counter of respective structural components such as the shutter 7 and the magnetic head 3 in a card reader.

The procedure for counting up the count value in the respective FC[*]'s in the EEPROM 1 is as follows. In other words, the whole data of the block including the corresponding FC[*] is read into the RAM 5 and the bits of the block data are shifted and an AND processing is applied to the block data by software to extract the corresponding FC[*] and count-up is performed. After that, the data after having been counted up is embedded into the above-mentioned block data by software to form a new updated block data, which is written into the EEPROM 1.

Specifically, at fist, count is performed from zero to 0xFFFF times by using DB[0][0]. At the time of next count-up, the memory region shown in DB[0][0] is cleared to zero and the count value (initial value is zero) of the FC[0] is counted up by one. Further, count is performed from zero to 0xFFFF times by using DB[0][0] again. When count is performed to the 0xFFFF times, at the time of next count-up, the memory region shown in DB[0][0] is cleared to zero again and the count value (current value is one) of the FC [0] is counted up by one.

When the above-mentioned procedure is repeated and count is performed up to 0xF (hexadecimal number: F) times in the FC[0], this means that the count-up of 0~0x10000 (=65,536) is performed up to 0x0F (=15) times in the DB[0] [0]. Therefore, 983,040 times of count-up are performed in total. As a result, since about 1,000,000 times of data updating are performed, at the next time, the count-up is not performed in the DB [0][0] and the next count-up is started in the DB [0][1].

In the next DB[0][1], similarly to the DB[0][0], whenever count is performed up to 0xFFFF times, at the time of the next count-up, the count value of the FC[1] is counted up by one. When the count is performed up to 0xF in the FC[1], the count-up is not performed in the DB[0][1] and the next count-up is started in the next DB[0][2]. Similarly repeatedly performed, the count is performed in the DB[0][2] and DB[0][3] while managed by the FC [2] and FC [3].

In this manner, when processing is repeated in all the 4 blocks of DB[0][0] ~DB[0][3], 3,932,160 (=0x3C0000) times of count-up has been finished.

When 3,932,160 times of count-up have been finished, all of the memory regions shown in FC[0], FC[1], FC[2], FC[3] in the full-count number of times managing region 200 are cleared to zero. Simultaneously, the count value (initial value is zero) of TR1 in the transaction completion number of times managing region 300 is counted up by one.

Next, the FC[0] through FC[3] manages DB[1][0] through DB[1][3]. In other words, whenever count is performed up to 0xFFFF times in the DB[1][0], at the next count-up time, the count value of the FC[0] is counted up by one and, when the count is performed op to 0xF in the FC[0], the count-up in the DB[1][0] is not performed and the count-up in the subsequent DB[1][1] is started. Similarly repeatedly performed, the count is performed in the DB[1][1] through DB[1][3] while managed by the FC[1] through FC[3].

In this manner, the count-up in the TR1 in the transaction completion number of times managing region 300 is appropriately performed while the memory regions shown in FC[0] through FC[3] are cleared to zero, and the count-up in the DB[0][0] through DB[0][3], the DB[1][0] through DB[1][3], the DB[2][0] through DB[2][3] and the DB[3][0] through DB[3][3] is performed. And, when the count-up in the DB[3] [3] has been finished, the count value of TR1 becomes to be 4, which means that the count-up is performed up to 15,728,640 (=0xF00000) times. When the processing is fisher repeated, the count becomes 16,777,215 times during the processing in the second block (DB[4][1]) at the time the count value of the TR1 is 4.

Next, in order to obtain the total amount of the count value in the memory region shown in the DB[0][0] through DB[4] [1], the value may be obtained by the following calculation:

{(the count value in the *TR*1 in the transaction completion number of times managing region 300×4)+(the number of blocks in which count has finished up to the full count of 0*x*0*F* times in the current transaction))×0*xF*0000+(the number of counts in the block where current updating is performed).

More specifically, the method will be described with reference to the flowchart shown in FIG. 4.

FIG. 4 is a flowchart showing a calculation method for a count value when a nonvolatile memory in accordance with an embodiment is used as a counter. Various variables are stored in the RAM 5 and the values of the variables stored in the RAM 5 are read out by the CPU 2.

In FIG. 4, the EEPROM 1 is accessed by the CPU 2 and "0" is substituted for a variable "i" and a variable "FnshBlckCntf" (step S1). Next it is judged whether the FC[i] is 0x0F or not (step S2). When it is judged that FC[i] is 0x0F, the variable "i" and the variable "FnshBlckCn" are respectively incremented by one (step S3).

On the other hand, when it is judged that the FC[i] is not 0x0F, (FC[i]×0x10000)+DB[TR1][i]) is substituted for a variable "Current_Block_Count"(step S4). Then, {(TR1)×4+ FnshBlckCnt}×0xF0000+Current_Block_Count is substituted for a variable "Total_Count"(step S5). In this manner, the CPU 2 can recognize the total amount of count values in the memory regions shown in DB[0][0] through DB[4][1] by reading out the variable "Total_Count".

As described in detail above, according to an embodiment of the present invention, a counter function can be realized by using a nonvolatile memory. Further, although a general-purpose nonvolatile memory is used, a memory region where erase rewriting is performed without the data of a counter value is not updated is reduced as much as possible and thus a memory region is capable of using efficiently with less waste.

Further, the full-count number of times managing region 200 in accordance with an embodiment of the present invention does not update the management data whenever each block in the count data region 100 is rewritten but the management data is updated whenever each block in the count data region 100 is rewritten plural times. In addition, the management data in the full-count number of times managing region 200 manages the count data region 100 and is utilized in calculation of the total sum of a counter.

In this embodiment, only TR1 in the transaction completion number of times managing region 300 is used in the memory region shown in FIG. 3. However, for example, TR2 may be used for the open/close number of times of the shutter 9 which is detected by the actuator 8, and TR3 may be used for the ejected (or taken) number of times of a card which is detected by the photo sensors 10. According to the structure described above, a part of memory region which is not used as a counter function can be reduced and thus further efficient memory management can be realized in comparison with the conventional memory management.

FIG. 5 is a view showing the memory region of a nonvolatile memory in accordance with another embodiment. The count data region 100 and the full-count number of times managing region 200 in the memory region shown in FIG. 5 are similar to those shown in FIG. 3 and thus their detailed description is omitted.

As shown in FIG. 5, in a nonvolatile memory (EEPROM 1) in accordance with this another embodiment, each of the nibbles (TR1, TR2, TR3, TR4) in the transaction completion number of times managing region 300 is a bit string which is respectively comprised of four bits (b0 through b3). In order to manage the full-counted number of times of the full-count number of times managing region 200, either one bit of the bit string is set to be "1" and all the other bits are set to be "0".

More specifically described with respect to "TR1", when the full-counted number of times of the full-count number of times managing region 200 is "0", all the "b0" through the "b3" of the "TR1" remain "0"("0000"). When the full-counted number of times of the full-count number of times managing region 200 is "1", the CPU 2 sets only the "b0" of the "TR1" to be "1". As a result, the bit pattern of the "TR1" becomes to be "0001". Next when the full-counted number of times of the full-count number of times managing region 200 is "2", the CPU2 sets only the "b1" of the "TR1" to be "1". As a result the bit pattern of the "TR1" becomes to be "0010". Further, when the full-counted number of times of the full-count number of times managing region 200 is "3", the CPU 2 sets only the "b2" of the "TR1" to be "1". As a result the bit pattern of the "TR1" becomes to be "0100". Finally, when the full-counted number of times of the full-count number of times managing region 200 is "4", the CPU 2 sets only the "b3" of the "TR1" to be "1". As a result the bit pattern of the "TR1" becomes to be "1000".

In this manner, the full-counted number of times, i.e., "1", "2", "3" and "4", of the full-count number of times managing region 200 can be expressed in the bit pattern in which either one bit only of the 4 bits is set to be "1". "TR2", "TR3" and "TR4" can be similarly expressed in the bit pattern which either one bit only of the 4 bits is set to be "1".

For example, in a card reader in accordance with an embodiment the reciprocating number of times of a card with respect to the magnetic head is correlated to "TR1", the opening and closing number of times of the shutter is correlated to "TR2", the setting number of times of the IC contacts is correlated to "TR3", and the ejecting number of times of a card is correlated to "TR4". In this case, when the reciprocating number of times of a card to the magnetic head becomes to be 15,728,640 times, in other words, when "1" is set in the "b3" of the "TR1", it is judged that the service lifetime of the magnetic head has expired. Similarly, when the opening and closing number of times of the shutter becomes to be 7,864,320 times, in other words, when "1" is set in the "b1" of the "Th2", it is judged that the service lifetime of the shutter has expired. When the setting number of times of the IC contacts becomes to be 3,932,160 times, in other words, when "1" is set in the "b0" of the "TR3", it is judged that the service lifetime of the IC contacts has expired. When the ejecting number of times of a card becomes to be 11,796,480 times, in other words, when "1" is set in the "b2" of the "TR4", it is judged that the service lifetime of the card section mechanism (for example, the motor 7 or the photo sensors 10) has expired.

The CPU 2 refers to the bit patterns of the "TR1" through the "TR4" in the transaction completion number of times managing region 300 to judge whether be "TR1" is "1000" or not, whether the "TR2" is "0010",whether the "TR3" is "0001" or not, and whether the "TR4" is "0100" or not. Specifically, the transaction completion number of times managing region 300 of the EEPROM 1 is accessed by the CPU 2 to read the bit string of "TR1" through "TR4 collectively and then an AND processing of "0100000100101000" (0x4128) is applied to the bit string. As a result, when the data after the AND processing is performed is "0", it is detected that all their service lifetimes of the magnetic head, the shutter, the IC contacts and the card ejection mechanism have not expired. However, when even one bit of the data after the AND processing is performed is not "0", (in other words, when at least either one bit of the data is "1"), it is detected that either of the service lifetimes of the magnetic head, the shutter, the IC contacts, and the card section mechanism has expired. Further, it can be detected at a high speed which service lifetime of a structural component has expired by separately referring the bit patterns in the respective bit strings of "TR1" through "TR4".

Next a calculation method for a count value when a nonvolatile memory is used as a counter will be described with reference to FIG. 6 and a service lifetime detection method for a magnetic head, a shutter, IC contacts and a card ejection mechanism will be described with reference to FIG. 7.

FIG. 6 is a flowchart showing a calculation method for a count value when a nonvolatile memory in accordance with another embodiment is used as a counter. Various variables are stored in the RAM 5 and the values of the variables stored in the RAM 5 are read out by the CPU 2. Next a calculation method of the reciprocating number of times with respect to a magnetic head by using "TR1" will be described below.

In FIG. 6, similarly to the flow chart shown in FIG. 4, "0" is substituted for a variable "i" and a variable "FnshBlckCnt" (step S11), and then it is judged whether the FC[i] is "0x0F" or not (step S12). When it is judged that the FC[i] is "0x0F", the variable "i" and the variable "FnshBlckCnf" are respectively incremented by one (step S13). When it is judged that the FC[i] is not "0x0F", ((FC[i]×0x10000)+DB[TR1][i]) is substituted for a variable "Current_Block_Count" (step S14).

Next, the bit pattern in the TR1 is converted into a number in accordance with a rule which is determined in advance. Specifically, for example, when the bit pattern of the TR1 is "0001", the number of times is once, when the bit pattern of the TR1 is "0010", the number of times is twice, when "0100", the number of times is three times, and when "1000", four times. After conversion, the converted number is substituted for a "TR1_Num" (step S15).

Next, "{(TR1_Num)×4+FnshBlckCnt}×0xF0000+CurrentBlock_Count" is substituted for a variable "Total_Count" (step S5).

In this manner, the CPU 2 can recognize the total sum of the count values in the memory regions shown in the DB[0][0] through the DB[4][1] by reading the variable "Total_Count".

FIG. 7 is a flowchart showing a service lifetime detection method for structural components of an electronic device (card reader) in accordance with another embodiment. Various variables are stored in the RAM 5.

First TR1, TR2, TR3 and TR4 in the memory regions of the EEPROM 1 is accessed by the CPU 2 and 1 word (2 bytes) is read out to substitute for a variable "LifeManageDate" (step S21).

Next an AND processing of the variable "LifeManageDate" and "0100000100101000" (0x4128) is performed (step S22). Then, the value after the AND processing is performed is substituted for the variable "Life_Limit" (step S22) and it is judged whether the "Life_Limit" becomes "0" or not (step S23). When the value of the "Life_Limit" is "0", their service life times of the magnetic head, the shutter, the IC contacts and the card ejection mechanism have not expired and thus normal processing is continued (step S24).

On the other hand, when the "Life_Limit" is not "0", it is judged that either of the service lifetimes of the magnetic head, the shutter, the IC contacts and the card ejection mechanism has expired, and thus a maintenance mode is adopted and an alarm signal is transmitted to a HOST (for example, ATM in the bank) (step S25). In this case, the region corresponding to the TR1 through the TR4 in the variable "Life_Limit" which is obtained as described above is searched and the expiration of the service lifetime of the function (structural component) corresponding to the region that is not "0" may be transmitted to the HOST.

As described above, 1 word (2 bytes) data is obtained from the transaction completion number of times managing region 300 and the relevant bit of the data is masked to judge whether the value is "0" or not "0". As a result the detection of the total service lifetime of a card reader provided with a plurality of functions can be performed and, in addition, the service lifetime can be detected at a high speed.

As a comparison example, in a detection method in which 4-bit data are respectively obtained from TR1 through IR4 in the transaction completion number of times managing region 300 and they are recognized as four numerical values by software and, in which when either of the four numerical values reaches a predetermined numerical value, it is judged that the service lifetime of either of the structural components has expired, it is difficult to detect the service lifetime of the structural components at a high speed. On the other hand, in the card reader in accordance with an embodiment of the present embodiment the data of the TR1 through the TR4 in the transaction completion number of times managing region 300 are collectively obtained and, when the value obtained by masking the relevant bit of the data is not "0", at least either one of the structural components is judged such that its service lifetime has expired. Therefore, according to the service lifetime detection method as this embodiment, since the number of times of calculation processing is reduced (in this embodiment the calculating number of times is reduced to about 50%), the time required for calculation processing is shortened. Accordingly, a card reader which is capable of detecting the expiration of the service lifetimes at a high speed can be provided.

In this present specification, the values of number of times of 1, 2, 3 and 4 are respectively correlated to four bit patterns of "0001", "0010", "0100" and "1000". However, the present invention is not limited to this embodiment and any four bit pattern may be utilized where either one bit of 4 bits is "1" and other bits are "0".

Further, when the number of the blocks of the count data region 100 to be managed by the full-count number of tines managing region 200 is reduced, the expiration of the service lifetime can be detected with less number of times. Specifically, in FIG. 3, the full-count number of times managing region 200 manages four blocks of the count data region 100. However, for example, as shown in FIG. 8, the full-count number of times managing region 200 may manage two blocks, or may manage only one block as shown in FIG. 9.

In FIG. 8, two blocks of the count data region 100 are managed by using the FC[0] and the FC[1], and the FC[2] and FC[3] are left to be unused. Further, it is structured that, at the time when the FC[0] and the FC[1] have reached "0xF", the transaction completion number of times managing region 300 is incremented by one. In this manner, the expiration of the service lifetime can be detected with less number of times.

In FIG. 9, only the FC[0] manages one block of the count data region 100 and the FC[1] trough FC[3] are not used. And, it is structured that, at the time when the FC[0] has reached "0xF", the transaction completion number of times managing region 300 is incremented by one. In this manner, the expiration of the service lifetime can be detected with less number of times.

Alternatively, as a method for detecting the expiration of the service lifetime with a finer degree, for example, it may be structured that three blocks of the count data region 100 are managed in the full-count number of times managing region 200 and, at the time when both the FC[0] and FC[1] reach "0xF" and the FC[2] reaches "0x3", the transaction completion number of times managing region 300 is incremented by one. According to the structure described above, the expiration of the service lifetime can be detected with finer number of times. Similarly, even in the case shown in FIG. 9, for example, it may be structured that at the time when the FC [0] reaches "0x4", the transaction completion number of times managing region 300 is incremented by one.

INDUSTRIAL APPLICABILITY

A nonvolatile memory in accordance with the present invention and an electronic device which utilizes the nonvolatile memory are effectively applicable to those in which a memory resource is required to be efficiency used with less waste. Further, a nonvolatile memory in accordance with the present invention is effectively applicable to those in which the expiration of service lifetimes of structural components in an electronic device is detected with a high speed.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the clams are therefore intended to be embraced therein.

What is claimed is:

1. A nonvolatile memory comprising:
   a count data region which is provided in a memory region and which includes a first group of a plurality of blocks, where each of the blocks of the first group is sequentially used to count up according to updating data; and
   a first number of times managing region which is provided in a memory region and which includes a single block with a plurality of parts which are the same number as the number of blocks in the first group, where the first number of times managing region manages a full-counted number of times in the blocks of the first group of the count data region;

a second number of times managing region which is provided in a memory region and which manages a full-counted number of times that is full-counted when all of the parts of the single block of the first number of times managing region are full counted;

wherein the parts of the single block are provided so as to correspond respectively to the blocks of the first group;

wherein, after a first part of the single block corresponding to a first block of the first group is full-counted, a second block of the first group is used to count up according to succeeding updating data, and a second part of the single block is used to manage a full-counted number of times in the second block of the first group; and wherein each of the count data region and the first number of times managing region is structured with a block unit which is previously determined in the nonvolatile memory as a rewriting minimum unit for the updating data;

wherein each of the count data region, the first number of times managing region, and the second number of times managing region is structured with a block unit which is previously determined in the nonvolatile memory as a rewriting minimum unit for the updating data;

wherein the second number of times managing region includes a bit string comprised of a predetermined number of bits and manages the full-counted number of times of the first number of times managing region by means of that one bit of the bit string is set to be "1" and all other bits of the bit string being set to be "0"; and wherein the full-counted number of times of the first number of times managing region is recognized by detecting which bit of the bit string is set to be "1".

2. An electronic device comprising:
a nonvolatile memory comprising:
  a count data region which includes a first group of a plurality of blocks, where each of the blocks of the first group is sequentially used to count up according to updating data;
  a first number of times managing region which includes a single block with a plurality of parts which are the same number as the number of blocks in the first group, where the first number of times managing region manages a full-counted number of times in the blocks of the first group of the count data region;
  a second number of times managing region which manages a full-counted number of times that is full-counted when all the parts of the single block of the first number of times managing region are full-counted;
  wherein the parts of the single block are provided so as to correspond respectively to the blocks of the first group; and
  wherein, after a first part of the single block corresponding to a first block of the first group is full-counted, a second block of the first group is used to count up according to succeeding updating data, and a second part of the single block is used to manage a full-counted number of times in the second block of the first group;
  wherein each of the count data region, the first number of times managing region, and the second number of times managing region is structured with a block unit which is previously determined in the nonvolatile memory as a rewriting minimum unit for the updating data; and
a data processing means which reads and writes data from and in the nonvolatile memory;
wherein the second number of times managing region manages a used number of times of structural components in the electronic device on the basis of processing results of the data processing means;
wherein the second number of times managing region includes a bit string comprised of a predetermined number of bits; and
wherein the used number of times of the structural component in the electronic device is managed by the data processing means which sets one bit of the bit string to be "1" and all other bits of the bit string to be "0".

3. The electronic device according to claim 2;
wherein the second number of times managing region includes a plurality of the bit strings in correspondence with used number of times of a plurality of structural components in the electronic device; and
wherein the data processing means detects an expiration of service lifetimes of the structural components in the electronic device by referring to the bit patterns of the plurality of bit strings.

4. The electronic device according to claim 3;
wherein the electronic device is a card reader; and
wherein the structural component is one of a magnetic head, a shutter, IC contacts, and a card ejection mechanism.

* * * * *